United States Patent [19] [11] 4,328,304
Tachikawa et al. [45] May 4, 1982

[54] DESENSITIZING SOLUTION FOR LITHOGRAPHIC PRINTING PLATE

[75] Inventors: Hiromichi Tachikawa; Yohonosuke Takahashi; Kazuo Ishii; Tomoaki Ikeda; Fumiaki Shinozaki, all of Asaka, Japan

[73] Assignee: Fuji Photo Film Co., Ltd., Kanagawa, Japan

[21] Appl. No.: 78,267

[22] Filed: Sep. 24, 1979

[30] Foreign Application Priority Data

Sep. 22, 1978 [JP] Japan ................................ 53/117728

[51] Int. Cl.$^3$ .............................................. G03F 7/02
[52] U.S. Cl. .................................... 430/331; 430/302; 430/306; 430/961
[58] Field of Search ............... 430/306, 302, 331, 961, 430/249

[56] References Cited

U.S. PATENT DOCUMENTS

| 2,865,873 | 12/1958 | Hodgins et al. | 430/331 |
| 3,091,533 | 5/1963 | Hodgins | 430/331 |
| 3,347,674 | 10/1967 | De Haes et al. | 430/249 |
| 3,392,019 | 7/1968 | Barnes et al. | 430/466 |
| 3,518,088 | 6/1970 | Dunn et al. | 430/466 |
| 3,619,217 | 11/1971 | West | 430/331 |
| 3,698,904 | 10/1972 | Fukui et al. | 430/331 |
| 3,745,028 | 7/1973 | Rauney | 430/331 |
| 4,137,081 | 1/1979 | Pohl | 430/306 |

Primary Examiner—Won H. Louie, Jr.
Attorney, Agent, or Firm—Sughrue, Mion, Zinn, Macpeak & Seas

[57] ABSTRACT

A novel desensitizing solution is disclosed which is applied to the surface of a lithographic printing plate coated with a photosensitive layer of a photopolymerizable composition, the desensitizing solution contains a hydrophilic colloid, a free radical polymerization inhibitor and water.

17 Claims, No Drawings

DESENSITIZING SOLUTION FOR LITHOGRAPHIC PRINTING PLATE

BACKGROUND OF THE INVENTION

1. Field of the Invention

This invention relates to a desensitizing solution applied to a sensitized lithographic plate having a layer of photopolymerizable composition.

2. Description of the Prior Art

Among many types of currently available sensitized lithographic printing materials, a lithographic printing plate using a photopolymerizable composition as a photosensitive layer is known to have a long running impression and therefore can be used for printing a large number of sheets. One example of the photopolymer conventionally applied to a lithographic plate is a photosensitive material which mainly consists of a photodimerizable sensitive resin, for instance, a combination of a polyester of p-phenylene diacrylate and 1,4-cyclohexane diol (described in Belgian Pat. No. 696,533), or a reaction product of phenoxy resin and cinnamic acid (described in U.S. Pat. No. 3,387,976), and a polymerizable compound having an ethylenic unsaturated bond, and a binder. Examples of the combination of the ethylenic unsaturated compound with binder are described in U.S. Pat. No. 3,043,805, which include esters such as diethylene glycol diacrylate, triethylene glycol dimethacrylate, and pentaerythritol triacrylate (as the ethylenic unsaturated compound) plus resins such as methyl methacrylate/methacrylic acid copolymer and styrene/itaconic acid copolymer (as the binder). A photosensitive lithographic printing material coated with such as photopolymerizable material is imagewise exposed through a negative pattern and developed by a developer such as an organic solvent or an aqueous alkali which dissolves and removes the unexposed area.

Recently, a dry processable recording material has been proposed as an alternative to the above-described printing material that is processed by a liquid developer. Japanese Patent Publication Nos. 9663/63 and 22901/68 (U.S. Pat. No. 3,353,955) as well as Japanese Patent Application (OPI) Nos. 7728/72 (U.S. Pat. No. 3,770,438) (The term "OPI" as used herein refers to a "published unexamined Japanese patent application") and 46315/75 describe such a new recording material which makes use of the photopolymerization of a photopolymer and the resulting change in adhesive strength. To be more specific, this type of recording material comprises a plastic, metal or paper substrate which is coated with a layer of photosensitive composition containing a polymer as binder and an initiator of photopolymerization of unsaturated monomer, said layer being further overlaid with a cover of a thin transparent film. After imagewise exposure with the original placed on the cover, the cover is peeled off to have the exposed area (or unexposed area) of the photosensitive layer left on the substrate and the unexposed area (or exposed area) left on the cover so that a negative and a positive image (or positive and negative image) are formed on the substrate and cover, respectively. A photosensitive lithographic printing plate using a photopolymerizable composition in such peelable photosensitive material is described in Japanese Patent Application (OPI) No. 9501/77 and Japanese Patent Application No. 66353/76.

A lithographic printing plate is usually subjected to desensitization for rendering the non-image area hydrophilic. Desensitization (1) completely removes the photosensitive layer which was not removed by development, (2) enhances the hydrophilicity of the non-image area by chemical treatment of the metal surface, and (3) further enhances the hydrophilicity of the non-image area by adsorption of hydrophilic colloidal particles. Functions (1) and (2) are accomplished by cronak treatment, phosphate treatment, nital treatment or zirconium salt treatment. Function (3) is generally achieved by coating with gum arabic. To prevent reaction between the photosensitive layer and the substrate, a presensitized plate is generally subjected to anodization of the aluminum substrate or chemical treatment with zirconium fluoride, or with sodium silicate as described in U.S. Pat. No. 2,714,066. Such treatments are effected prior to coating of a photosensitive solution, and after development, an aqueous solution mainly consisting of gum arabic is used to gum the plate for desensitization.

While the primary purpose of gumming is to protect the hydrophilicity of the non-image area, it also has the effect of preventing sebum secreted by fingers, other greasy matter and dust from staining the prepared plate during storage until its use for printing as well as preventing oxidation from occurring during temporary shutdown of a printing machine.

In recent years, there has been a demand in the printing industry for a printing plate of longer running impression. For this purpose, the entire surface of a lithographic printing plate having a photpolymerizable sensitive layer is irradiated with actinic rays after its imagewise exposure and development. Generally referred to as post-exposure or re-exposure, this treatment promotes the polymerization of the image area until it is completely hardened.

However, with a lithographic printing plate that makes use of the photopolymerization of a photosensitive layer which is to be developed by a liquid developer, it is impossible to remove the unhardened area completely by development. In addition, if the developer has been used to process a number of printing plates, the photopolymerizable compound released will be adsorbed on the non-image area and, upon post-exposure, will be polymerized to give a stained non-image area during printing. Likewise, development of a printing plate that uses a peelable cover causes a trace of photopolymerizable composition to be left on the non-image area, and this composition will be polymerized upon post-exposure to give a stained non-image area during printing.

SUMMARY OF THE INVENTION

As a result of various studies to overcome such defects of the conventional technique, a desensitizing solution has been found which can be applied to a lithographic printing plate having a photopolymerizable composition without any chance of spoiling the non-image area even if the plate is subjected to post-exposure of its entire surface after image-wise exposure and development.

It is therefore a primary object of this invention to provide a desensitizing solution which is applicable to a lithographic printing plate having a photopolymerizable composition without staining the non-image area even if it is subjected to post-exposure or post-heating after making the plate.

DETAILED DESCRIPTION OF THE INVENTION

This invention relates to a desensitizing solution which contains a polymerization inhibitor and is applied to a lithographic printing plate having an image formed thereof by photopolymerization.

The desensitizing solution for a lithograhic printing plate of this invention comprises a hydrophilic colloidal substance, a free radical polymerization inhibitor, and water.

The hydrophilic colloidal substance which is the first ingredient of the desensitizing solution of this invention acts as a binder for the ingredients in the desensitizing solution other than water. It also has the effect of rendering the lithographic printing plate hydrophilic. In addition, it has weak affinity for both an oil-based ink receptive printing image and oil-based printing ink and as soon as printing starts it is capable of removing solid ingredients in the desensitizing solution from the printing image.

A suitable hydrophilic colloidal substance can be selected from the polymer compounds described in *Hydrophilic polymers,* ed. by Matao Nakamura, Kagaku Kogyo-Sha (1973), Tokyo; *Water-Soluble Resins,* ed. by R. L. Davidson and M. Sitting, Van Nostrand Reinhold (1968), New York; and Japanese Patent Publication No. 5093/60. Specific examples include gum arabic, gelatin, cellulose derivatives such as methyl cellulose, ethyl cellulose, carboxymethyl cellulose, carboxyethyl cellulose, ethyl hydroxyethyl cellulose, ethyl methyl cellulose, hydroxymethyl cellulose, hydroxyethyl cellulose, hydroxydipropyl cellulose, hydroxyethylmethyl cellulose, hydroxypropylmethyl cellulose, sodium carboxymethyl cellulose, sodium carboxymethylhydroxyethyl cellulose, sodium cellulose sulfate, etc., dextrin, shellac, alginates, polyvinyl pyrrolidone, polyvinyl alcohol or derivatives thereof, polyacrylamide or copolymers thereof, acrylic acid copolymers, vinyl methyl ethyl/maleic anhydride copolymer, vinyl acetate/maleic anhydride copolymer, styrene/maleic anhydride copolymer and the like. These polymer compounds may be used independently or as a mixture. Of these colloids, gum arabic is preferred. The water-soluble colloidal substance is contained in the desensitizing solution of this invention in an amount in the range of from about 0.1 to about 20 wt%, preferably from about 0.4 wt% to about 15 wt%, based on the total weight of the ingredients of the solution.

The free radical polymerization inhibitor which is the second characteristic ingredient of the desensitizing solution prevents the residual polymerizable compound on the non-image area from geing polymerized by post-exposure or post-heating, thus preventing the formation of a stained non-image area during printing. Examples of the free radical polymerization inhibitor are quinone compounds, amine compounds, nitro compounds, nitroso compounds, nitron compounds, phenols, disulfides, hydrazines, mercaptans, thioethers, dithiocarbamic acids, sulfene amides, phosphates, phosphites, phosphines and borates. More specific examples indlude hydroquinone, p-benzoquinone, chlorobenzoquinone, 2,5-dichloro-p-benzoquinone, 2,6-dichloro-p-benzoquinone, 2,3-dimethyl-p-benzoquinone, methoxy-p-benzoquinone, methyl-p-benzoquinone, o,m,p-phenylenediamine, phenyl-$\beta$-naphthylamine, diphenylamine, N-N'-diphenyl-p-phenylenediamine, p-hydroxydiphenylamine, o,m,p-dinitrobenzene, 2,4-dinitrotoluene, 1,3,5-trinitrobenzene, 1,3,5-trinitroanisole, 1,3,5-trinitrotoluene, dinitrodurene, o,m,p-nitrophenol, 2,4-dinitrophenol, o,m,p-nitrophenylcarboxylic acid, o,m,p-nitroaniline, 2,4,6-trinitrophenol, nitrosobenzene, methyl-$\alpha$-nitrosoisopropyl ketone, phenyl-t-butylnitron, pyrogallol, catechol, $\alpha$- or $\beta$-naphthol, tertiary butyl catechol, tertiary butyl phenol, 2,4,6-trimethylphenol, cresol, o,m,p-isopropylphenol, 2-amino-4-methylphenol, tetramethylthiuram disulfide, 2,2-benzoylaminodiphenyl disulfide, 2-mercaptoimidazole, 2-mercaptobenzimidazole, zinc diethyl dithiocarbamate, N-oxydiethylene benzotriazole, 2-sulfene amide, tri-n-butyl phosphine, triphenyl phosphite, trimethyl phosphate, and triphenyl borate. These and other polymerization inhibitors are disclosed in *Polymer Handbook,* ed. by Immergut and Brandrup, John Wiley & Sons, 2nd ed., pp II-53–55. The inhibitors may be used independently or as a mixture. The polymerization inhibitor is contained in the desensitizing solution of this invention in an amount in the range of from about 0.001 to 20 wt%, preferably from 0.5 to 5 wt%, based on the total weight of the ingredients of the solution.

The third ingredient of the desensitizing solution of this invention is water, which functions as the solvent of the solution. Suitable water is distilled water, deionized water, water from which solid matter has been removed by filtration, tap water or the like. Since water is used to fill the portion of the desensitizing solution that is left unoccupied by the other ingredients, its content is not to be limited to any specific range, but preferably it is contained in an amount in the range of from about 40 to 90 wt% based on the total weight of the ingredients of the solution.

The desensitizing solution of this invention may optionally contain additional ingredients, for example, acidic compounds such as phosphoric acid, nitric acid, sulfuric acid, chromic acid and tannic acid, or basic compounds such as sodium silicate, sodium metasilicate, potassium silicate and potassium hydroxide. These additional ingredients have the effect of rendering the non-image area of a lithographic printing plate hydrophilic.

The desensitizing solution of this invention preferably contains one or more compounds selected from the group consisting of a nonionic surfactant and a polyhydroxyalkane. When applied to a lithographic printing plate, the desensitizing solution containing these compounds spreads well, suitably controls the drying, maintains for a desired period the effect of rendering the non-image area hydrophilic, gives a strain-free non-image area, and as soon as printing starts, the desensitizing solution has its ingredients other than water easily removed from the printing image by being carried in oil-based printing ink. The nonionic surfactant or polyhydroxyalkane used in this invention is a water-soluble compound which is preferably hygroscopic. Specific examples of such compound are polyalkylene glycols, polyethylene glycol alkyl ethers, polyethylene glycol alkylphenyl ethers, polyethylene glycol esters, polyalkanols containing therein three or more hydroxy groups, phosphoric acid esters of alkanols, and phosphoric acid esters of monohydroxyethers.

Examples of the polyalkylene glycol are compounds of the formula HO$-(C_zH_{2z}O)_a$H (wherein z is an integer of from 1 to 6, and a is an integer of from 1 to about 500) such as ethylene glycol, propylene glycol, butylene glycol, pentane diol, hexylene glycol, trimethylene glycol, tetramethylene glycol, hexamethylene glycol, diethylene glycol, triethylene glycol, tetraethylene glycol, dipropylene glycol, tripropylene glycol, and polyethylene glycol. Examples of the polyethylene glycol alkyl ether include polyethylene glycol alkyl monoether and diether which have a degree of polymerization of ethylene glycol in the range of from about 5 to about 30 and wherein the alkyl group has 12 to 25 carbon atoms. Examples of the polyethylene glycol alkylphenyl ether include polyethylene glycol alkylphenyl monoether and diether which have a degree of polymerization of ethylene glycol in the range of from about 5 to about 30 and wherein the alkylphenyl group is a phenyl group substituted with an alkyl group having 1 to 12 carbon atoms. Specific examples are p-(6-methylheptyl)phenyl ether and nonylphenyl ether of polyethylene glycol, and octyl phenoxypolyethoxyethanol. Examples of the polyethylene glycol ester include polyethylene glycol monoester and diester which have a degree of polymerization of ethylene glycol in the range of from about 5 to about 30 wherein the ester-forming aliphatic acid is a saturated aliphatic acid having 12 to 30 carbon toms. Examples of the polyalkanol containing therein three or more hydroxy groups include glycerin, sorbitol, pentaerythritol, diglycerin, dipentaerythritol, and tripentaerythritol. Examples of the phosphoric acid esters of alkanols are hexanol phosphate, octanol phosphate and decanol phosphate. Specific examples of the phosphoric acid esters of monohydroxyethers are 2-octyloxyethanol phosphate and 2-decyloxyethanol phosphate. Polyalkanols containing therein three or more hydroxy groups or polyalkylene glycols are preferred. Particularly preferred are ethylene glycol, diethylene glycol, propylene glycol, hexamethylene glycol, glycerin, sorbitol and pentaerythritol.

The nonionic surfactant or polyhydroxyalkane illustrated above is contained in the desensitizing solution of this invention in an amount in the range of from about 3 to about 30 wt%, preferably from about 7 to about 20 wt%, based on the total weight of the ingredients of the solution.

The desensitizing solution of this invention may further contain an organic solvent to promote the penetration of the desensitizing solution into the lithograhic printing plate as well as to release the residual photosensitive composition from the non-image area. Any type of organic solvent can be used if it dissolves or swells the photosensitive composition. Specific examples of the organic solvent include glycol ethers such as 2-methoxyethanol, 2-ethoxyethanol, 2-butoxyethanol and 2-phenoxyethanol; ketones such as methyl ethyl ketone, methyl isobutyl ketone and diacetone alcohol; esters such as butyl acetate, isoamyl acetate and n-amyl acetate; and alcohols such as butyl alcohol and benzyl alcohol. The organic solvent illustrated above is contained in the desensitizing solution of this invention in an amount in the range of from about 0.1 to about 20 wt%, preferably from about 1 to about 10 wt%, based on the total weight of the ingredients of the solution.

In addition to these ingredients, the desensitizing solution of this invention preferably contains an anionic surfactant to increase the miscibility of the solvent with water. Examples of the anionic surfactant are fatty acid salts, salts of sulfuric acid esters of higher alcohols, salts of phosphoric acid esters of aliphatic alcohols, sulfonates of dibasic fatty acid esters, sulfonates of fatty acid amides, ($C_1$–$C_5$) alkyl allyl sulfonates, alkyl esters of sulfoaliphatic acids, naphthalenesulfonic acid salt condensed with formaldehyde. A condensate of naphthalenesulfonic acid and formalin is preferred. The anionic surfactant is contained in the desensitizing solution of this invention in an amount in the range of from about 0.1 to about 20 wt%, preferably from about 1 to about 10 wt%, based on the total weight of the ingredients of the solution.

The desensitizing solution of this invention may contain an acetate to prevent staining of the non-image area. Examples of the acetate are sodium acatate, potassium acatate, calcium acetate, magnesium acetate, ammonium acetate, and zinc acetate. Sodium acetate and potassium acetate are preferred.

If desired, the desensitizing solution of this invention may further contain at least one compound selected from the group consisting of molybdic acid, boric acid, nitric acid, phosphoric acid, polyphosphoric acid and water-soluble alkali metal salts (e.g., Li, Na, K) and ammonium salts thereof. Such compound is added to prevent fouling of the desensitizing solution as well as to enhance and maintain the hydrophilicity of the non-image area of the lithographic printing plate, etc. It should not react with the other ingredients of the desensitizing solution to form a precipitate or gel. Experiments have demonstrated that the above acids, water-soluble alkali metal salts or ammonium salts thereof are free from such precipitation or gelation.

Specific examples of the compound added to achieve the above stated purposes include salts of molybdic acid such as lithium molybdate, sodium molybdate, potassium molybdate, ammonium heptamolybdate (($NH_4$)$_6Mo_7O_{24}$.$4H_2O$), sodium phosphomolybdate ($Na_3PO_4$.$12MoO_3$), and ammonium phosphomolybdate (($NH_4$)$_3PO_4$.$12MoO_3$$3H_2O$); salts of boric acid such as lithium metaborate ($LiBO_2$.$2H_2O$), lithium tetraborate ($Li_2B_4O_7$.$5H_2O$), sodium metaborate ($NaBO_2$), sodium tetraborate ($Na_2B_4O_7$.$10H_2O$), sodium decaborate ($Na_2B_{10}O_{16}$.$10H_2O$), sodium perborate ($NaBO_2$.$H_2O_2$.$3H_2O$), sodium borate peroxyhydrate ($Na_2B_4O_7$.$H_2O_2$.$9H_2O$), sodium boroformate ($NaH_2BO_3$.$2HCOOH$.$2H_2O$), potassium metaborate ($KBO_2$), potassium tetraborate ($K_2B_4O_7$.$5H_2O$), ammonium tetraborate (($NH_4$)$_2B_4O_7$.$4H_2O$), and ammonium biborate (($NH_4$)$HB_4O_7$.$3H_2O$); salts of phosphoric acid such as sodium phosphate, sodium hydrogenphosphate, sodium dihydrogenphosphate, potassium phosphate, potassium hydrogenphosphate, potassium dihydrogenphosphate, sodium pyrophosphate, potassium pyrophosphate, sodium metaphosphate, potassium metaphosphate, sodium polymetaphosphate, potassium polymetaphosphate, sodium polyphosphate, and potassium polyphosphate; and salts of nitric acid such as lithium nitrate, sodium nitrate and ammonium nitrate.

These acids, water-soluble alkali metal salts or ammonium salts thereof are contained in the desensitizing solution of this invention in an amount in the range of from about 0.01 to about 10 wt%, preferably from about 0.2 to about 5 wt%, based on the total weight of the ingredients of the solution.

This invention will hereunder be described in greater detail by reference to the following Examples.

EXAMPLE 1

A mechanically grained 2S aluminum substrate for lithographic printing plate (aluminum alloy consisting of 99% aluminum, 0.6% magnesium and silicon 0.4%) was immersed in a 2 wt% aqueous sodium hydroxide at 40° C. for a period of 1 minute to partially etch its surface. After washing with water, the etched plate was immersed in a mixture of sulfuric acid and chromic acid for a period of about 1 minute to expose the surface of pure aluminum, then immersed in 20% sulfuric acid at 30° C. to be anodized at a voltage of 15 V D.C. and a current density of 3A/dm².

The anodized plate was immersed in aqueous sodium molybdate (having a concentration of 2.0 wt% and a temperature of 65° C.) for a period of 90 seconds, and dried.

The following composition was dissolved in a mixture of 100 ml of methyl ethyl ketone and 20 ml of N,N-dimethylformamide to prepare a solution of photosensitive composition.

| | |
|---|---|
| Chlorinated polyethylene (Superchlon CPE-907LTA, a product of Sanyo Kokusaku Pulp Co., Ltd. | 10 g |
| Pentaerythritol trimethacrylate | 10 g |
| 2-Methyl anthraquinone | 0.2 g |
| Hydroquinone | 0.1 g |
| Copper phthalocyanine dye | 0.2 g |

(Superchlon CPE-907LTA is a polymer having a viscosity of about 90 cps in 40% toluene at 25° C. and a chlorine content of about 69 wt%.)

The resulting solution was applied to the separately prepared aluminum substrate with a coating machine (whirler) until the photosensitive layer was about 4 μm thick after removal of the solvent. The substrate was dried at 80° C. for a period of 7 minutes and laminated with a 12 μm thick polyethylene terephthalate film under pressure to thereby prepare a sensitized lithographic printing plate. Seven more plates were prepared in the same manner. Each plate was exposed through a negative film for a period of 17 seconds to a PS light of type S (a 2 kw metal halide lamp manufactured by Fuji Photo Film Co., Ltd.) placed at a distance of 1 meter. Upon lapse of 17 seconds for exposure, the polyethylene terephthalate film was peeled off the substrate upon which a photoset positive image (for printing) was formed. The unhardened area (unexposed area) was removed by being carried in the polyethylene terephthalate film.

The resulting eight lithographic plates were then treated with eight different desensitizing solutions of the following formulations. Eight more lithographic printing plates were prepared by transporting at 30 mm/sec the above plates while the entire surface of each plate was exposed to a 2 kw mercury lamp (ORC-AHH-2000/C, a product of Ohku Mfg. Co., Ltd.) placed at a distance of 15 cm which caused the surface of the plate to be illuminated with a light intensity of from about 1,000 to about 1,450 μw/cm²).

| Formulations of Desensitizing Solutions: | |
|---|---|
| Desensitizing Solution (1) | |
| Carboxymethyl cellulose (Celogen 7A, a product of Dai-Ichi Kogyo Seiyaku Co., Ltd.) | 10 g |
| Sodium silicate JIS No.3 (a product of The Nippon Chemical Industrial Co., Ltd.) | 75 g |
| p-Nitrophenol | 50 g |
| Glycerin | 150 g |
| Ethylene glycol monobutyl ether | 50 g |
| Demol NL (a product of Kao-Atlas Co., Ltd.) | 50 g |
| Sodium molybdate | 5 g |
| Water | 750 g |
| Desensitizing Solution (2) | |
| Sodium alginate | 3 g |
| p-Nitrophenylacetic acid | 60 g |

| Formulations of Desensitizing Solutions: | |
|---|---|
| Sodium metasilicate | 90 g |
| Ethylene glycol | 80 g |
| Diacetone alcohol | 70 g |
| Demol NL | 50 g |
| Potassium acetate | 5 g |
| Water | 700 g |
| Desensitizing Solution (3) | |
| Dextrin (a product of Kanto Chemical Co., Inc.) | 10 g |
| p-Aminophenol | 50 g |
| Potassium metasilicate | 100 g |
| Glycerin | 100 g |
| Butyl acetate | 50 g |
| Perex NBL | 50 g |
| Sodium molybdate | 5 g |
| Water | 600 g |
| Desensitizing Solution (4) | |
| Gum arabic | 100 g |
| Phosphoric acid (85 wt % aq. soln.) | 40 g |
| Ammonium dichromate | 80 g |
| o-Phenylenediamine | 60 g |
| Water | 1,000 g |
| Desensitizing Solution (a) (control) | |
| Polyvinyl pyrrolidone (a product of Tokyo Kasei Kogyo K.K.) | 15 g |
| Sodium silicate JIS No. 3 | 90 g |
| Hexamethylene glycol | 50 g |
| Glycerin | 50 g |
| Sodium dihydrogenphosphate | 4 g |
| Water | 900 g |
| Desensitizing Solution (b) (control) | |
| Carboxymethyl cellulose | 10 g |
| Phosphoric acid (85 wt % aq. soln.) | 40 g |
| Ammonium phosphate | 30 g |
| Water | 1,000 g |
| Desensitizing Solution (c) (control) | |
| Vinylmethyl ether/maleic anhydride copolymer | 25 g |
| Amine silicate silica sol (40 wt % aq. soln.) (QAS-40, a product of Nissan Chemical Industries, Ltd.) | 145 g |
| Ethylene glycol | 50 g |
| Potassium nitrate | 3 g |
| Water | 700 g |
| Desensitizing Solution (d) (control) | |
| Carboxymethyl cellulose (Celogen 7A) | 20 g |
| Sodium silicate JIS No. 3 | 100 g |
| Glycerin | 110 g |
| Sodium molybdate | 4 g |
| Water | 750 g |

The lithographic printing plates treated with these desensitizing solutions were used for printing under the conditions set forth below. The printing plates treated with the desensitizing solutions (1) to (4) but not subjected to post-exposure were free from stains on the non-image area and could print about 40 thousand sheets of paper.

Those printing plates which were subjected to post-exposure after treatment with the desensitizing solutions (1) to (4) were not only free from stains on the non-image area but could print at least 150 thousand sheets of paper. On the other hand, when the controls (treated with desensitizing solutions (a) to (d)) were subjected to post-exposure, the non-image area of each plate was excessively spoiled, thus failing to produce commercially acceptable printed matter.

| Printing Conditions | |
|---|---|
| Printing machine: | Heidel SORK-Z |
| Printing ink: | Webking KOPN (a product of Toyo Ink Mfg. Co., Ltd.) |
| Damping water: | fresh water |

| Printing Conditions | |
|---|---|
| Printing speed: | 7,500 sheets/hour |

EXAMPLE 2

A photosensitive solution of the following formulation was applied to two aluminum substrates of Example 1 with a coating machine (whirler) until the photosensitive layer was about 2 μm thick after removal of the solvent. Each substrate was dried at 100° C. for a period of 2 minutes.

| Trimethylol propane triacrylate | 8 g |
|---|---|
| Acrylic acid/methylacrylate copolymer (molar ratio 80:20) | 10 g |
| 2-Methyl anthraquinone | 0.1 g |
| Methyl ethyl ketone | 60 ml |
| Methyl cellosolve acetate | 60 ml |

Each sensitized plate was exposed through a negative film for a period of 60 seconds to a PS light of type S (a 2 kw metal halide lamp manufactured by Fuji Photo Film Col., Ltd.) placed at a distance of 1 meter. Thereafter, the plates were developed in aqueous sodium hydroxide (4 g of NaOH in 1 liter of water), washed with water and treated with the desensitizing solutions (4) and (b). Two more lithographic plates were prepared by the same procedure as described above and transported at 30 mm/sec while the entire surface of each plate was exposed to a 2 kw mercury lamp (ORC-AHH-2000/c, a product of Ohku Mfg. Co., Ltd.) placed at a distance of 15 cm.

These lithographic plates were used for printing under the same conditions used in Example 1. Whether subjected to post-exposure or not, the printing plate treated with the desensitizng solution (4) was entirely free from stains on the non-image area. The plate which was not post-exposed could print 20 thousand sheets of paper whereas the post-exposed plate could print at least 100 thousand sheets of paper. Post-exposure of the plate treated with the desensitizing solution (b) formed stains on the non-image area, thus failing to produce commercially acceptable printed matter.

While the invention has been described in detail and with reference to specific embodiments thereof, it will be apparent to one skilled in the art that various changes and modifications can be made therein without departing from the spirit and scope thereof.

What is claimed is:

1. A desensitizing solution which is to be applied to the surface of a lithographic printing plate coated with a photosensitive layer composed of a photopolymerizable composition, said desensitizing solution containing a hydrophilic colloid, a free radical polymerization inhibitor which is not a developing agent for silver halide photographic materials and is an organic compound selected from the group consisting of quinone compounds, nitro compounds, nitroso compounds, nitron compounds, α- or β-naphthol, tertiary butyl catechol, tertiary butyl phenol, 2,4,6-trimethylphenol, cresol, o-, m- or p-isopropylphenol, 2-amino-4-methylphenol, disulfides, mercaptans, thioethers, dithiocarbamic acids, sulfene amides, phosphates, phosphites, phosphines, borates, phenyl-β-naphthylamine, diphenylamine and mixtures thereof in an amount sufficient to normally prevent selectively the formation of stain on non-imaged areas during printing, and water.

2. The desensitizing solution of claim 1, wherein said hydrophilic colloid is selected from the group consisting of gum arabic, gelatin, cellulose derivatives, shellac, alginates, polyvinyl pyrrolidone, polyvinyl alcohol or derivatives thereof, polyacrylamide or copolymers thereof, acrylic acid copolymers, vinyl methyl ether/maleic anhydride copolymer, vinyl acetate/maleic anhydride copolymer, and styrene/maleic anhydride copolymer.

3. The desensitizing solution of claim 1, wherein said hydrophilic colloid is present in an amount of about 0.1 to 20 wt%.

4. The desensitizing solution of claim 1, wherein said polymerization inhibitor is present in an amount of about 0.001 to 20 wt%.

5. The desensitizing solution of claim 1, wherein said solution additionally comprises a nonionic surfactant or a polyhydroxyalkane.

6. The desensitizing solution of claim 5, wherein said surfactant or polyhydroxyalkane is present in an amount of about 3 to 30 wt%.

7. The desensitizing solution of claim 1 additionally comprising an organic solvent.

8. The desensitizing solution of claim 7, wherein said solvent is present in an amount of about 0.01 to 20 wt%.

9. The desensitizing solution of claim 1 additionally comprising an anionic surfactant.

10. The desensitizing solution of claim 9, wherein said anionic surfactant is present in an amount of about 0.1 to 20 wt%.

11. The desensitizing solution of claim 1 additionally comprising an acetate.

12. The desensitizing solution of claim 1 additionally comprising at least one compound selected from the group consisting of molybdic acid, boric acid, nitric acid, phosphoric acid, polyphosphoric acid and water-soluble alkali metal salts and ammonium salts thereof.

13. The desensitizing solution of claim 6, wherein said polyhydroxyalkane is a polyalkylene glycol, a polyethylene glycol alkyl ether, a polyethylene glycol alkylphenyl ether, a polyethylene glycol ester, a polyalkanol containing therein three or more hydroxy groups, a phosphoric acid ester of an ankanol, or a phosphoric acid ester of a monohydroxy ether.

14. The desensitizing solution of claim 1, wherein said solution additionally comprises a polyalkylene glycol represented by the formula $HO\text{-}(C_zH_{2z}O)_aH$ wherein z is an integer of 1 to 6 and a is an integer of from 1 to about 500.

15. The desensitizng solution of claim 1, wherein said hydrophilic colloid is gum arabic.

16. The desensitizing solution of claim 1, wherein said free radical polymerization inhibitor is a nitro compound.

17. The desensitizing solution of claim 1, wherein the free radical polymerization inhibitor is selected from the group consisting of p-benzoquinone, chlorobenzoquinone, 2,5-dichloro-p-benzoquinone, 2,6-dichloro-p-benzoquinone, 2,3-dimethyl-p-benzoquinone, methoxy-p-benzoquinone, methyl-p-benzoquinone, phenyl-β-naphthylamine, diphenylamine, o,m or p-dinitrobenzene, 2,4-dinitrotoluene, 1,3,5-trinitrobenzene, 1,3,5-trinitroanisole, 1,3,5-trinitrotoluene, dinitrodurene, o,m or p-nitrophenol, 2,4-dinitrophenol, o,m or p-nitrophenylcarboxylic acid, o,m or p-nitroaniline, 2,4,6-trinitrophenol, nitrosobenzene, methyl-α-nitrosoisopropyl ketone, phenyl-t-butylnitron, α- or β-naphthol, tertiary butyl catechol, tertiary butyl phenol, 2,4,6-trimethylphenol, cresol, o,m or p-isopropylphenol, 2-amino-4-methylphenol, tetramethylthiuram disulfide, 2,2-benzoylaminodiphenyl disulfide, 2-mercaptoimidazole, 2-mercaptobenzimidazole, zinc diethyl dithiocarbamate, N-oxydiethylene benzotriazole, 2-sulfene amine, tri-n-butyl phosphine, triphenyl phosphite, trimethyl phosphate, p-nitrophenyl acetic acid, and triphenyl borate.

* * * * *